(12) United States Patent
Guo

(10) Patent No.: US 6,596,594 B1
(45) Date of Patent: Jul. 22, 2003

(54) METHOD FOR FABRICATING FIELD EFFECT TRANSISTOR (FET) DEVICE WITH ASYMMETRIC CHANNEL REGION AND ASYMMETRIC SOURCE AND DRAIN REGIONS

(75) Inventor: Jyh-Chyurn Guo, Chutung Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/080,814

(22) Filed: Feb. 22, 2002

(51) Int. Cl.[7] ............... H01L 21/336; H01L 21/425
(52) U.S. Cl. ............... 438/279; 438/286; 438/303; 438/304; 438/305; 438/306; 438/525
(58) Field of Search ................ 438/179, 231, 438/279, 286, 302–306, 525, 531, 595

(56) References Cited

U.S. PATENT DOCUMENTS

| | | | |
|---|---|---|---|
| 5,380,788 A | * 1/1995 | Stein et al. | 438/199 |
| 5,409,848 A | * 4/1995 | Han et al. | 438/302 |
| 5,534,447 A | * 7/1996 | Hong | 438/305 |
| 5,554,544 A | * 9/1996 | Hsu | 438/302 |
| 5,780,902 A | * 7/1998 | Komuro | 257/344 |
| 5,925,914 A | * 7/1999 | Jiang et al. | 257/344 |
| 5,998,274 A | * 12/1999 | Akram et al. | 438/306 |
| 6,168,999 B1 | * 1/2001 | Xiang et al. | 438/286 |
| 6,429,063 B1 | * 8/2002 | Eitan | 438/232 |

OTHER PUBLICATIONS

Fundamentals of Morden VLSI devices, Yuan Taur and Tak H. Ning, 1998, p. 194.*
C. Duvvury et al., Relability Design of P+ Pocket implant LDD transistors, IEDM 90, 9.2.1, pp. 215 to 218.*

* cited by examiner

Primary Examiner—Wael Fahmy
Assistant Examiner—Shrinivas H. Rao
(74) Attorney, Agent, or Firm—Tung & Associates

(57) ABSTRACT

Within a method for fabricating a field effect transistor (FET) device there is provided a series of ion implant methods which provide the field effect transistor (FET) device with both: (1) a source region asymmetrically doped with respect to a drain region; and (2) an asymmetrically doped channel region. The field effect transistor (FET) device is fabricated with enhanced performance.

11 Claims, 2 Drawing Sheets

US 6,596,594 B1

METHOD FOR FABRICATING FIELD EFFECT TRANSISTOR (FET) DEVICE WITH ASYMMETRIC CHANNEL REGION AND ASYMMETRIC SOURCE AND DRAIN REGIONS

BACKGROUND OF THE INVENTION

1. Field of the Invention

The present invention relates generally to methods for fabricating field effect transistor (FET) devices. More particularly, the present invention relates to methods for fabricating, with enhanced performance, field effect transistor (FET) devices.

2. Description of the Related Art

Semiconductor integrated circuit microelectronic fabrications are formed from semiconductor substrates within and upon which are formed semiconductor devices and over which are formed patterned conductor layers which are separated by dielectric layers.

Common in the art of semiconductor integrated circuit microelectronic fabrication for use when fabricating semiconductor integrated circuit microelectronic fabrications are field effect transistor (FET) devices. Field effect transistor (FET) devices are common in the art of semiconductor integrated circuit microelectronic fabrication as switching devices within both semiconductor integrated circuit microelectronic memory fabrications and semiconductor integrated circuit microelectronic logic fabrications.

While field effect transistor (FET) devices are thus common in the art of semiconductor integrated circuit microelectronic fabrication and often essential in the art of semiconductor integrated circuit microelectronic fabrication, field effect transistor (FET) devices are nonetheless not entirely without problems in the art of semiconductor integrated circuit microelectronic fabrication. In that regard, and as semiconductor integrated circuit microelectronic fabrication integration levels have increased and semiconductor device dimensions have decreased, it has become increasingly more difficult in the art of semiconductor integrated circuit microelectronic fabrication to fabricate within semiconductor integrated circuit microelectronic fabrications field effect transistor (FET) devices with enhanced performance.

It is thus desirable in the art of semiconductor integrated circuit microelectronic fabrication to fabricate within semiconductor integrated circuit microelectronic fabrications field effect transistor (FET) devices with enhanced performance.

It is towards the foregoing object that the present invention is directed.

Various methods have been disclosed in the art of semiconductor integrated circuit microelectronic fabrication for fabricating within semiconductor integrated circuit microelectronic fabrications field effect transistor (FET) devices with desirable properties.

Included among the methods, but not limiting among the methods, are methods disclosed within: (1) Hiroki et al., in U.S. Pat. No. 5,830,788 (a method for fabricating a field effect transistor (FET) device with enhanced performance by fabricating the field effect transistor (FET) device with an asymmetric channel region); (2) Hsu et al., in U.S. Pat. No. 5,891,782 (a method for fabricating a field effect transistor (FET) device with enhanced performance by fabricating the field effect transistor (FET) device with an asymmetric channel region of width narrower than a gate electrode formed thereover); (3) Jiang et al., in U.S. Pat. No. 5,925,914 (a method for fabricating a field effect transistor (FET) device with enhanced performance by fabricating the field effect transistor (FET) device with asymmetric source/drain regions); (4) Krivokapic, in U.S. Pat. No. 5,960,291 (another method for fabricating a field effect transistor (FET) device with enhanced performance by fabricating the field effect transistor (FET) device with an asymmetric channel region); (5) Gardner et al., in U.S. Pat. No. 6,146,934 (another method for fabricating a field effect transistor (FET) device with enhanced performance by fabricating the field effect transistor (FET) device with asymmetric source/drain regions); and (6) Xiang et al., in U.S. Pat. No. 6,168,999 (a method for fabricating a field effect transistor (FET) device with enhanced performance by fabricating the field effect transistor (FET) device with both an asymmetric channel region and asymmetric source/drain regions).

The disclosures of each of the foregoing references are incorporated herein fully by reference.

Desirable in the art of semiconductor integrated circuit microelectronic fabrication are additional methods and materials which may be employed for fabricating within semiconductor integrated circuit microelectronic fabrications field effect transistor (FET) devices with enhanced performance.

It is towards the foregoing object that the present invention is directed.

SUMMARY OF THE INVENTION

A first object of the present invention is to provide a a method for fabricating a field effect transistor (FET) device.

A second object of the present invention is to provide the method for fabricating the field effect transistor (FET) device in accord with the first object of the present invention, wherein the field effect transistor (FET) device is fabricated with enhanced performance.

A third object of the present invention is to provide the method for fabricating the field effect transistor (FET) device in accord with the first object of the present invention and the second object of the present invention, wherein the method is readily commercially implemented.

In accord with the objects of the present invention, there is provided by the present invention a method for fabricating a field effect transistor (FET) device.

To practice the method of the present invention, there is first provided a semiconductor substrate of a first polarity. There is then formed over the semiconductor substrate a gate electrode such as to define within the semiconductor substrate a source region separated from a drain region by a channel region defined beneath the gate electrode. There is then formed simultaneously within the semiconductor substrate a first source extension region within the source region, separated from a first drain extension region within the drain region, each of the foregoing first extension regions being of a second polarity opposite the first polarity. There is also formed simultaneously within the semiconductor substrate a first source side pocket implant region within the channel region adjoining the source region, separated from a first drain side pocket implant region within the channel region adjoining the drain region, each of the foregoing first pocket implant regions being of the first polarity. There is also formed within the semiconductor substrate a second source extension region of the second polarity formed at a location such as to at least in part overlap the first source extension region, but not a second drain extension region of the second polarity formed at a location such as to at least in part overlap the first drain extension region. Finally, there is also formed within the semiconductor substrate a second source side pocket implant region of the first polarity formed at a location such as to at least in part overlap the first source side pocket implant region, but not a second drain side pocket implant region formed at a location such as to at least in part overlap the first drain side pocket implant region.

The present invention provides a method for fabricating a field effect transistor (FET) device, wherein the field effect transistor (FET) device is fabricated with enhanced performance.

The present invention realizes the foregoing object by fabricating the field effect transistor (FET) device with both: (1) a source region asymmetrically doped with respect to a drain region; and (2) an asymmetrically doped channel region.

The method of the present is readily commercially implemented.

The present invention employs methods and materials as are generally conventional in the art of semiconductor integrated circuit microelectronic fabrication, but employed within the context of specific process limitations which provide, at least in part, the present invention. Since it is thus at least in part specific process limitations which provide the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a field effect transistor (FET) device, wherein the field effect transistor (FET) device is fabricated with enhanced performance.

The present invention realizes the foregoing object by fabricating the field effect transistor (FET) device with both: (1) a source region asymmetrically doped with respect to a drain region; and (2) an asymmetrically doped channel region.

While the preferred embodiment of the present invention illustrates the present invention within the context of fabricating, with enhanced performance, a metal oxide semiconductor field effect transistor (MOS-FET) device, the present invention may nonetheless be employed for fabricating, with enhanced performance, field effect transistor (FET) devices including but not limited to metal oxide semiconductor field effect transistor (MOS-FET) devices and metal semiconductor field effect transistor (MES-FET) devices.

Referring now to FIG. 1 to FIG. 6, there is shown a series of schematic cross-sectional diagrams illustrating the results of progressive stages in forming, in accord with a preferred embodiment of the present invention, a metal oxide semiconductor field effect transistor (MOS-FET) device within a semiconductor integrated circuit microelectronic fabrication.

Figure 1:
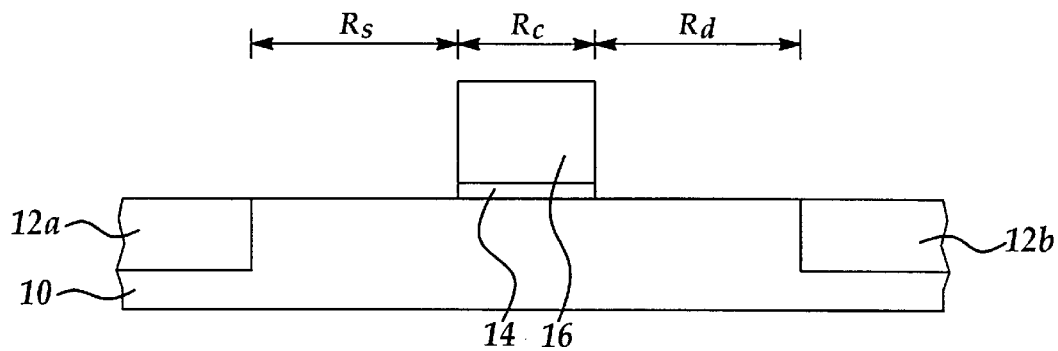
FIG. 1, FIG. 2, FIG. 3, FIG. 4, FIG. 5 and FIG. 6 show a series of schematic cross-sectional diagrams illustrating the results of progressive stages of forming, in accord with a preferred embodiment of the present invention, a metal oxide semiconductor field effect transistor (MOS-FET) device in accord with the present invention.

Shown within FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which define an active region of the semiconductor substrate 10.

Within the preferred embodiment of the present invention with respect to the semiconductor substrate 10, and although semiconductor substrates are known in the art of semiconductor integrated circuit microelectronic fabrication to be formed of various semiconductor materials (i.e., silicon semiconductor materials, germanium semiconductor materials, silicon-germanium alloy semiconductor materials, and compound (III-IV and II-VI) semiconductor materials (any of which may be employed within the context of the present invention)), either dopant polarity, various dopant concentrations and several crystallographic orientations, for the preferred embodiment of the present invention the semiconductor substrate 10 is typically and preferably a (100) silicon semiconductor substrate or a (100) silicon-germanium alloy semiconductor substrate, having a dopant concentration of from about 1E14 to about 1E15 dopant atoms per cubic centimeter.

Within the preferred embodiment of the present invention with respect to the pair of isolation regions 12a and 12b, and although isolation regions are known in the art of semiconductor integrated circuit microelectronic fabrication to be formed employing methods including but not limited to isolation region thermal growth methods and isolation regions deposition/patterning methods, for the preferred embodiment of the present invention the pair of isolation regions 12a and 12b is typically and preferably formed, as is illustrated within the schematic cross-sectional diagram of FIG. 1, as a pair of shallow trench isolation (STI) regions.

Shown also within the schematic cross-sectional diagram of FIG. 1, and formed upon the active region of the semiconductor substrate 10, is a gate dielectric layer 14 in turn having formed aligned thereupon a gate electrode 16.

Within the preferred embodiment of the present invention, both the gate dielectric layer 14 and the gate electrode 16 may be formed employing methods and materials as are otherwise generally conventional in the art of semiconductor integrated circuit microelectronic fabrication.

For example, and without limitation, the gate dielectric layer 14 is typically and preferably formed of a silicon oxide gate dielectric material formed to a thickness of from about 10 to about 100 angstroms upon the active region of the semiconductor substrate 10. Similarly, and also for example, and also without limitation, the gate electrode 16 is typically and preferably formed of a doped polysilicon material (having a dopant concentration of at least about 5E19 dopant atoms per cubic centimeter) or polycide material (doped polysilicon/metal silicide stack material), formed to a thickness of from about 1000 to about 3000 angstroms aligned upon the gate dielectric layer 14.

As is finally illustrated within the schematic cross-sectional diagram of FIG. 1, the active region of the semiconductor substrate 10 is divided into three regions, consisting of: (1) a source region Rs; separated from (2) a drain region Rd; by (3) a channel region Rc defined beneath the gate electrode 16.

Figure 2:
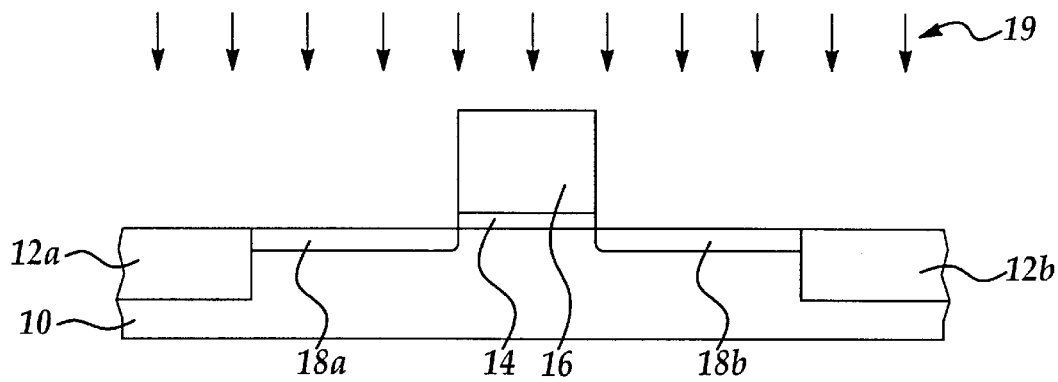

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is simultaneously formed into source region Rs a first source extension region 18a and formed into the drain region Rd a first drain extension region 18b, while employing the gate electrode 16 and the gate dielectric layer 14 as a mask, in conjunction with a dose of nominally orthogonal first dopant implanting ions 19.

Within the preferred embodiment of the present invention, the dose of first dopant implanting ions 19 is of a second polarity opposite the first polarity of the semiconductor substrate 10, and the dose of first dopant implanting ions 19 is provided at an ion implantation dose and an ion implantation energy such as to provide both of the first source extension region 18a and the first drain extension region 18b of the second dopant polarity formed to a depth within the source region Rs and the drain region Rd of from about 100 to about 1000 angstroms and having a dopant concentration of from about 1E17 to about 1E18 dopant atoms per cubic centimeter.

Figure 3:
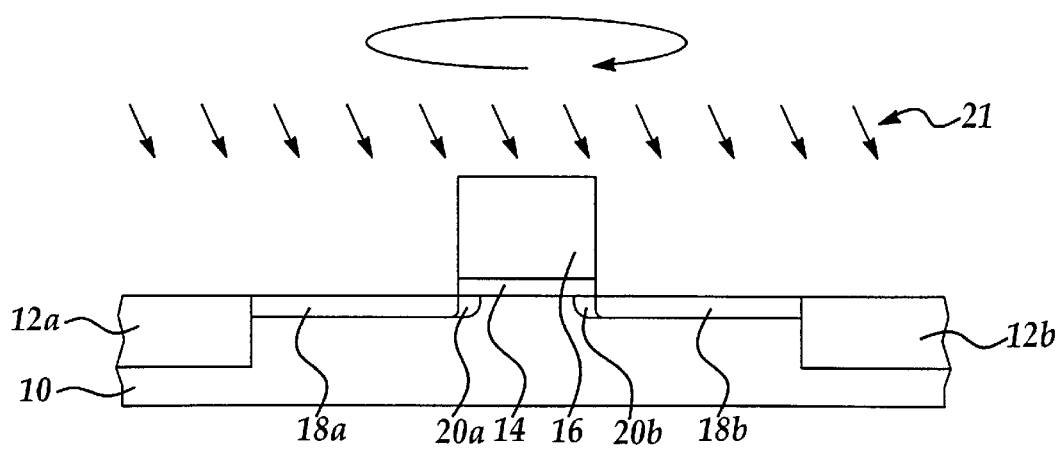

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is simultaneously formed into the channel region Rc adjoining the source region Rs a first source side pocket implant region 20a formed separated therefrom into the channel region Rc adjoining the drain region Rd a first drain side pocket implant region 20b, while employing the gate electrode 16 and the gate dielectric layer 14 as a mask, in conjunction with a dose of second dopant implanting ions 21 which is provided while employing a tilt angle implant method. The tilt angle implant method provides for rotation of the semiconductor substrate 10 with respect to a dopant ion implantation beam which is provided at a tilt angle $\Theta$ of from $\Theta$ about 0 to about 60 degrees with respect to a normal to the semiconductor substrate 10.

Within the preferred embodiment of the present invention, the dose of second dopant implanting ions 21 is of the first polarity, and the dose of second dopant implanting ions 21 is provided at an ion implantation dose and an ion implantation energy such as to provide both of the first source side pocket implant region 20a and the first drain side pocket implant region 20b formed: (1) to a depth within the channel region Rc of from about 1000 to about 3000 angstroms; (2) with a lateral intrusion beneath a pair of opposite edges of the gate electrode 16 of from about 0.05 to about 0.25 microns; and (3) with a peak dopant concentration of from about 1E17 to about 1E19 dopant atoms per cubic centimeter.

Figure 4:
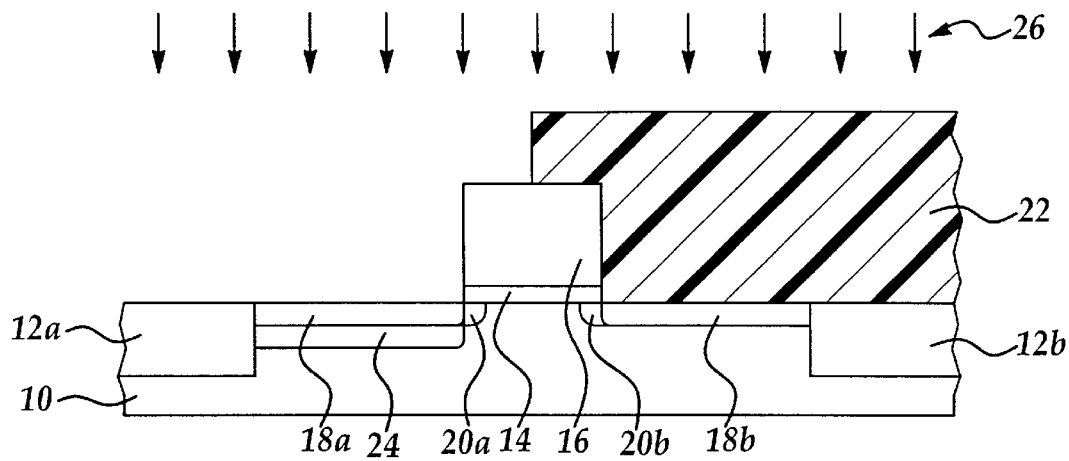

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed completely covering the drain region Rd of the semiconductor substrate 10 and partially covering the gate electrode 16 formed over the channel region Rc of the semiconductor substrate, while leaving exposed the source region Rs of the semiconductor substrate 10, a patterned photoresist layer 22.

Within the preferred embodiment of the present invention, the patterned photoresist layer 22 may be formed employing methods and materials as are conventional in the art of semiconductor integrated circuit microelectronic fabrication. Typically and preferably, the patterned photoresist layer 22 is formed to a thickness of from about 2500 to about 6000 angstroms.

Shown also within the schematic cross-sectional diagram of FIG. 4 is the results of forming within the source region Rs of the semiconductor substrate 10 a second source extension region 24 formed at a location such as to at least in part overlap the first source extension region 18a, incident to implantation of the source region Rs with a dose of third dopant implanting ions 26 while employing the gate electrode 16 and the patterned photoresist layer 22 as a mask. As is illustrated within the schematic cross-sectional diagram of FIG. 3, and incident to the presence of the patterned photoresist layer 22, there is not formed an analogous and correlating second drain extension region within the drain region Rd.

Within the preferred embodiment of the present invention, the dose of third implanting ions 26 is provided with the second polarity at an ion implantation dose and an ion implantation energy such as to provide the second source extension region 24 formed to a depth within the source region Rs of from about 150 to about 1500 angstroms and having a dopant concentration of from about 1E17 to about 1E19 dopant atoms per cubic centimeter.

Figure 5:
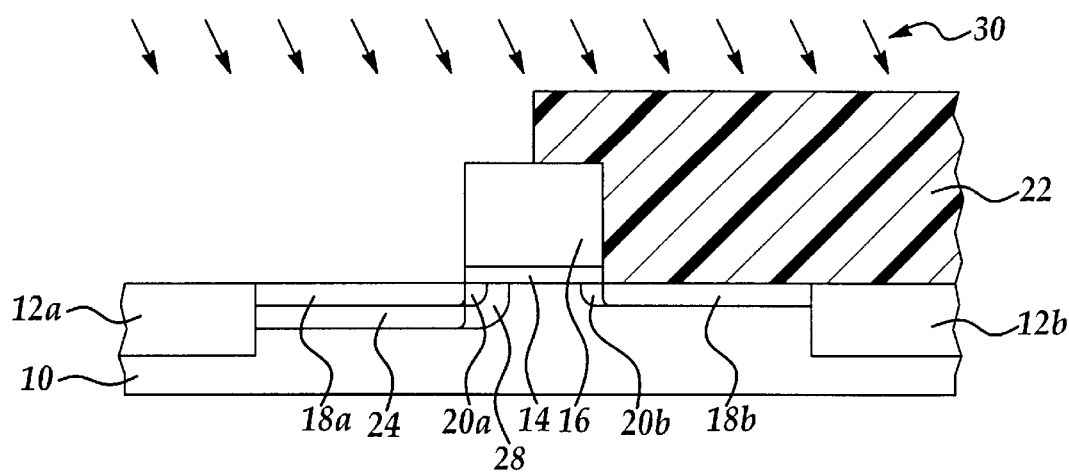

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed within the channel region of the semiconductor substrate 10, and adjoining the source region Rs of the semiconductor substrate 10, a second source side pocket implant region 28 formed at a location such as to at least in part overlap the first source side pocket implant region 19a. Within the preferred embodiment of the present invention, the second source side pocket implant region 28 is formed of the first polarity while employing a dose of fourth dopant implanting ions 30 which is also provided while employing a tilt angle implant method, and typically but not necessarily also rotating a dopant ion implantation beam with respect to the semiconductor substrate 10.

As is illustrated within the schematic cross-sectional diagram of FIG. 5, and due to the presence of the patterned photoresist layer 22, there is also not formed within the channel region an analogous and correlating second drain side pocket implant region.

Within the preferred embodiment of the present invention, the tilt angle implant method employed for forming the second source side pocket implant region 28 employs a tilt angle of from about 0 to about 60 degrees, an appropriate ion implantation dose and an appropriate ion implantation energy, such as to provide the second source side pocket implant region 28 of depth within the semiconductor substrate from about 1000 to about 3000 angstroms, lateral intrusion within the channel region Rc beneath the gate electrode 16 of from about 0.05 to about 0.25 microns and a peak dopant concentration of from about 1E17 to about 1E19 dopant atoms per cubic centimeter.

As is understood by a person skilled in the art, an ordering of: (1) a first ion implant method which provides the dose of first dopant implanting ions 19; (2) a second ion implant method which provides the dose of second dopant implanting ions 21; (3) a third ion implant method which provides the dose of third dopant implanting ions 26; and (4) a fourth ion implant method which provides the dose of fourth dopant implanting ions 30, may be rearranged in any permutation to fabricate the semiconductor integrated circuit microelectronic fabrication whose schematic cross-sectional diagram is illustrated in FIG. 5 from the semiconductor integrated circuit microelectronic fabrication whose schematic cross-sectional diagram is illustrated in FIG. 1, provided that there is employed a mask layer, such as the patterned photoresist layer 22, at appropriate times. Similarly, the process sequence from FIG. 1 to FIG. 5 preferably excludes the use of spacer layers formed adjoining a pair of gate electrode 16 sidewalls.

Figure 6:
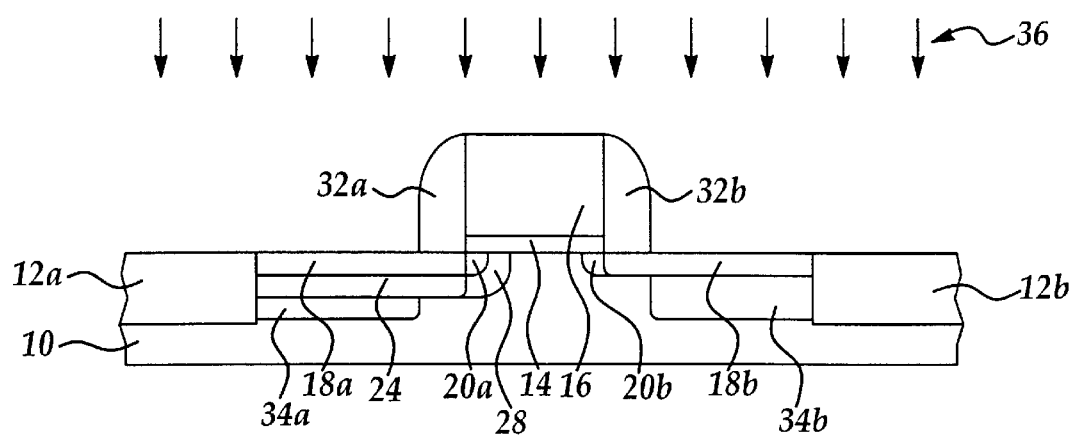

Referring now to FIG. 6, there is shown a schematic cross-sectional diagram illustrating the results of further processing of the semiconductor integrated circuit microelectronic fabrication whose schematic cross-sectional diagram is illustrated in FIG. 4.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, there is stripped from the gate electrode 16 and the drain region Rd of the semiconductor substrate 10 the patterned photoresist layer 22.

The patterned photoresist layer 22 may be stripped from the gate electrode 16 and the drain region Rd of the semiconductor substrate 10 while employing methods and materials as are generally conventional in the art of semiconductor integrated circuit microelectronic fabrication.

Similarly, there is also shown within the schematic cross-sectional diagram of FIG. 6 the results of forming adjoining a pair of opposite edges of the gate electrode 16 and the gate dielectric layer 14 a pair of spacer layers 32a and 32b.

Within the preferred embodiment of the present invention, the pair of spacer layers 32a and 32b may be formed employing methods and materials, which will typically and preferably include anisotropic etching methods as directed towards dielectric materials, as are otherwise generally conventional in the art of semiconductor integrated circuit microelectronic fabrication.

Shown also within the schematic cross-sectional diagram of FIG. 5, and formed into the source region Rs of the semiconductor substrate 10 and the drain region Rd of the semiconductor substrate 10 is a corresponding source region 34a and a corresponding drain region 34b, both of which are formed incident to implanting with a dose of fifth dopant implanting ions 36 while employing the gate electrode 16 and the pair of spacer layers 32a and 32b as a mask.

Within the preferred embodiment of the present invention, the dose of fifth dopant implanting ions 36 is provided of the second polarity, an appropriate dose and an appropriate energy such as to provide the source region 34a and the drain region 34b of depth from about 1000 to about 5000 angstroms and dopant concentration from about 1E20 to about 5E21 dopant atoms per cubic centimeter within the source region Rs of the semiconductor substrate 10 and the drain region Rd of the semiconductor substrate 10.

Upon forming the semiconductor integrated circuit microelectronic fabrication whose schematic cross-sectional diagram is illustrated in FIG. 6, there is formed a semiconductor integrated circuit microelectronic fabrication in accord with the preferred embodiment of the present invention. The semiconductor integrated circuit microelectronic fabrication has formed therein a field effect transistor (FET) device with enhanced performance incident to being formed with both: (1) a source region (in particular a source extension region) asymmetrically doped with respect to a drain region; and (2) an asymmetrically doped channel region.

As is understood by a person skilled in the art, the preferred embodiment of the present invention is illustrative of the present invention rather than limiting of the present invention. Revisions and modifications may be made to methods, materials, structures and dimensions employed for fabricating a semiconductor integrated circuit microelectronic fabrication in accord with the preferred embodiment of the present invention, while still providing a method for fabricating a semiconductor integrated circuit microelectronic fabrication in accord with the present invention, further in accord with the accompanying claims.

What is claimed is:

1. A method for fabricating a field effect transistor device comprising:

providing a semiconductor substrate of a first polarity;

forming over the semiconductor substrate a gate electrode such as to define within the semiconductor substrate a source region separated from a drain region by a channel region defined beneath the gate electrode;

forming simultaneously within the semiconductor substrate a first source extension region within the source region, separated from a first drain extension region within the drain region, each of the foregoing first extension regions being of a second polarity opposite the first polarity;

forming simultaneously within the semiconductor substrate a first source side pocket implant region within the channel region adjoining the source region, separated from a first drain side pocket implant region within the channel region adjoining the drain region, each of the foregoing first pocket implant regions being of the first polarity;

forming within the semiconductor substrate a second doped source extension region of the second polarity formed at a location such as to at least in part overlap the first source extension region, but not a second drain extension region of the second polarity formed at a location such as to at least in part overlap the first drain extension region; and forming within the semiconductor substrate a second source side pocket implant region of the first polarity formed at a location such as to at least in part overlap the first source side pocket implant region, but not a second drain side pocket implant region formed at a location such as to at least in part overlap the first drain side pocket implant region.

2. The method of claim 1 wherein the field effect transistor device is a metal oxide semiconductor field effect transistor device.

3. The method of claim 1 wherein the field effect transistor device is a metal semiconductor field effect transistor device.

4. The method of claim 1 wherein the first source extension region and the first drain extension region are both formed to a dopant concentration of from about 1E17 to about 1E18 dopant atoms per cubic centimeter.

5. The method of claim 1 wherein the second source extension region is formed to a dopant concentration of from about 1E17 to about 1E19 dopant atoms per cubic centimeter.

6. The method of claim 1 wherein the first source side pocket implant region and the first drain side pocket implant region are both formed to a peak dopant concentration of from about 1E17 to about 1E19 dopant atoms per cubic centimeter.

7. The method of claim 1 wherein the second source side pocket implant region is formed to a peak dopant concentration of from about 1E17 to about 1E19 dopant atoms per cubic centimeter.

8. The method of claim 1 wherein the first source side pocket implant region is formed before the second source side pocket implant region.

9. The method of claim 1 wherein the second source side pocket implant region is formed before the first source side pocket implant region.

10. The method of claim 1 wherein first source extension region is formed before the second source extension region.

11. The method of claim 1 wherein second source extension region is formed before the first source extension region.

* * * * *